United States Patent
Tsiatmas et al.

(10) Patent No.: US 10,747,122 B2
(45) Date of Patent: Aug. 18, 2020

(54) METHOD OF MEASURING A PARAMETER OF A DEVICE MANUFACTURING PROCESS, METROLOGY APPARATUS, SUBSTRATE, TARGET, DEVICE MANUFACTURING SYSTEM, AND DEVICE MANUFACTURING METHOD

(71) Applicant: ASML NETHERLANDS B.V., Veldhoven (NL)

(72) Inventors: Anagnostis Tsiatmas, Eindhoven (NL); Alok Verma, Eindhoven (NL); Bert Verstraeten, Lommel (BE)

(73) Assignee: ASML Netherlands B.V., Veldhoven (NL)

(*) Notice: Subject to any disclaimer, the term of this patent is extended or adjusted under 35 U.S.C. 154(b) by 0 days.

(21) Appl. No.: 16/347,944

(22) PCT Filed: Oct. 31, 2017

(86) PCT No.: PCT/EP2017/077914
§ 371 (c)(1),
(2) Date: May 7, 2019

(87) PCT Pub. No.: WO2018/086968
PCT Pub. Date: May 17, 2018

(65) Prior Publication Data
US 2019/0354024 A1    Nov. 21, 2019

(30) Foreign Application Priority Data
Nov. 10, 2016 (EP) .................... 16198272

(51) Int. Cl.
*G03B 27/32* (2006.01)
*G03F 7/20* (2006.01)
*G01N 21/47* (2006.01)

(52) U.S. Cl.
CPC ..... *G03F 7/70625* (2013.01); *G01N 21/4788* (2013.01); *G03F 7/7065* (2013.01); *G03F 7/70633* (2013.01)

(58) Field of Classification Search
CPC ............ G01N 21/4788; G03F 7/70466; G03F 7/70625; G03F 7/70633; G03F 7/7065
See application file for complete search history.

(56) References Cited

U.S. PATENT DOCUMENTS

2006/0066855 A1    3/2006    Boef et al.
2007/0229837 A1    10/2007   Schaar et al.
(Continued)

FOREIGN PATENT DOCUMENTS

| WO | 2009078708 | 6/2009 |
|---|---|---|
| WO | 2009106279 | 9/2009 |
| WO | 2010007010 | 1/2010 |

OTHER PUBLICATIONS

International Search Report and Written Opinion issued in corresponding PCT Patent Application No. PCT/EP2017/077914, dated Jan. 18, 2018.
(Continued)

*Primary Examiner* — Peter B Kim
(74) *Attorney, Agent, or Firm* — Pillsbury Winthrop Shaw Pittman LLP

(57) ABSTRACT

A method of measuring a parameter of a device manufacturing process is disclosed. The method includes measuring a target on a substrate by illuminating the target with measurement radiation and using an optical apparatus to detect the measurement radiation scattered by the target. The target has a target structure having a first periodic component and a second periodic component. The optical apparatus receives radiation resulting from diffraction of the measurement radiation from the target structure. The received radiation includes at least one diffraction order that would
(Continued)

not be received from diffraction of the measurement radiation from the first periodic component alone nor from diffraction of the measurement radiation from the second periodic component alone.

20 Claims, 12 Drawing Sheets

(56) References Cited

U.S. PATENT DOCUMENTS

| | | |
|---|---|---|
| 2008/0311344 A1 | 12/2008 | Kiers et al. |
| 2011/0027704 A1 | 2/2011 | Cramer et al. |
| 2017/0059999 A1* | 3/2017 | Van Der Schaar ......................... G03F 7/70683 |

OTHER PUBLICATIONS

Taiwanese Office Action issued in corresponding Taiwanese Patent Application No. 106138705, dated Sep. 7, 2018.
Finders, J., et al.: "Double patterning for 32nm and below: an update", Proc. of SPIE, vol. 6924, 2008.
Dasari, P., et al.: "Metrology characterization of spacer double patterning by scatterometry", Proc. of SPIE, vol. 7971, 2011.

* cited by examiner

METHOD OF MEASURING A PARAMETER OF A DEVICE MANUFACTURING PROCESS, METROLOGY APPARATUS, SUBSTRATE, TARGET, DEVICE MANUFACTURING SYSTEM, AND DEVICE MANUFACTURING METHOD

CROSS-REFERENCE TO RELATED APPLICATIONS

This application is the U.S. national phase entry of PCT patent application no. PCT/EP2017/077914, which was filed on Oct. 31, 2017, which claims the benefit of priority of European patent application no. 16198272.3 which was filed on Nov. 10, 2016 and which is incorporated herein in its entirety by reference.

FIELD

The present invention relates to a method of measuring a parameter of a device manufacturing process, a metrology apparatus, a substrate, a target, a device manufacturing system, and a device manufacturing method.

BACKGROUND

A lithographic apparatus is a machine that applies a desired pattern onto a substrate, usually onto a target portion of the substrate. A lithographic apparatus can be used, for example, in device manufacturing processes, such as in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to monitor a device manufacturing process such as a lithographic process, parameters of the patterned substrate (and therefore of any aspect of the device manufacturing process that affects the patterned substrate) are measured. Parameters may include, for example, the overlay error between successive layers formed in or on the patterned substrate and critical dimension (typically linewidth) of developed photosensitive resist and/or etched product features. Parameters may include feature heights and/or feature pitches. These measurements may be performed on a product substrate and/or on a dedicated metrology target. There are various techniques for making measurements of the microscopic structures formed in lithographic processes, including the use of scanning electron microscopes and various specialized tools. A fast and non-invasive form of specialized inspection tool is a scatterometer in which a beam of radiation is directed onto a target on the surface of the substrate and properties of the scattered or reflected beam are measured. By comparing the properties of the beam before and after it has been reflected or scattered by the substrate, the properties of the substrate can be determined. This can be done, for example, by comparing the reflected beam with data stored in a library of known measurements associated with known substrate properties or data calculated in real time from a model of the scattering structure. Two main types of scatterometer are known. Spectroscopic scatterometers direct a broadband radiation beam onto the substrate and measure the spectrum (intensity as a function of wavelength) of the radiation scattered into a particular narrow angular range. Angularly resolved scatterometers use a monochromatic radiation beam and measure the intensity of the scattered radiation as a function of angle.

Multiple patterning is a class of techniques used to increase feature density. In double patterning, for example, a lithographic process is enhanced to halve a minimum spacing between separate features. In quadruple patterning, a lithographic process is enhanced to reduce the minimum spacing by a factor of four.

Spacer patterning, which may also be referred to as Spacer Process Technology (SPT), is a multiple patterning technique in which layers are formed on sidewalls of pre-patterned features. The pre-patterned features are subsequently removed to leave two residual sidewall features for each pre-patterned feature. Where the widths of the pre-patterned features are exactly equal to the separations between the pre-patterned features, features formed using the residual sidewall features will be spaced apart from each with a single, common separation distance. Errors in the spacer patterned process can, however, cause the separation between adjacent features to vary. In the case of double patterning, the variation may comprise a separation distance that alternates. An alternating separation distance may be referred to as pitch walking. Pitch walking may occur for example when an error in the lithographic process causes the width of the pre-patterned features to be different to the separation between the pre-patterned features. Pitch walking may also arise in other forms of multiple patterning, for example in non-spacer techniques such as Litho-Etch-Litho-Etch (LELE).

Accurate measurement of properties of device manufacturing processes, including measurement of pitch walking resulting from a multiple patterning process, can be difficult, time consuming, or both.

SUMMARY

It is desirable to provide improved methods and apparatus for measuring a parameter of a device manufacturing process, and for performing the device manufacturing process.

According to an aspect of the invention, there is provided a method of measuring a parameter of a device manufacturing process, the method comprising: measuring a target on a substrate by illuminating the target with measurement radiation and using an optical apparatus to detect the measurement radiation scattered by the target, wherein: the target comprises a target structure having a first periodic component and a second periodic component; and the optical apparatus receives radiation resulting from diffraction of the measurement radiation from the target structure, the received radiation comprising at least one diffraction order that would not be received from diffraction of the measurement radiation from the first periodic component alone nor from diffraction of the measurement radiation from the second periodic component alone.

According to another aspect of the invention, there is provided a substrate comprising a target for use in measuring a parameter of a device manufacturing process by illuminating the target with measurement radiation and detecting measurement radiation scattered by the target, wherein: the target comprises a target structure having a first periodic component and a second periodic component; the first periodic component is provided in a first layer and the second periodic component is provided in a second layer, the second layer being above or below the first layer; and the second periodic component is configured so that a combined pitch of the first periodic component and the second periodic component is longer than a pitch of the first periodic component alone and longer than a pitch of the second periodic component alone.

According to another aspect of the invention, there is provided a target for use in device manufacturing in a measuring process, wherein: the target comprises a target structure having a first periodic component and a second periodic component; the first periodic component is provided in a first layer and the second periodic component is provided in a second layer, the second layer being above or below the first layer; and the second periodic component is configured so that a combined pitch of the first periodic component and the second periodic component is longer than a pitch of the first periodic component alone and longer than a pitch of the second periodic component alone.

According to another aspect of the invention, there is provided a metrology apparatus for measuring a parameter of a device manufacturing process, the metrology apparatus comprising: a substrate comprising a target; and an optical apparatus for measuring the target by illuminating the target with measurement radiation and detecting the measurement radiation scattered by the target, wherein: the target comprises a target structure having a first periodic component and a second periodic component; and the optical apparatus is configured to receive radiation resulting from diffraction of the measurement radiation from the target structure, the received radiation comprising at least one diffraction order that would not be received from diffraction of the measurement radiation from the first periodic component alone nor from diffraction of the measurement radiation from the second periodic component alone.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION OF EXEMPLARY EMBODIMENTS

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Before describing such embodiments in more detail, however, it is instructive to present an example environment in which embodiments of the present invention may be implemented.

Figure 1:
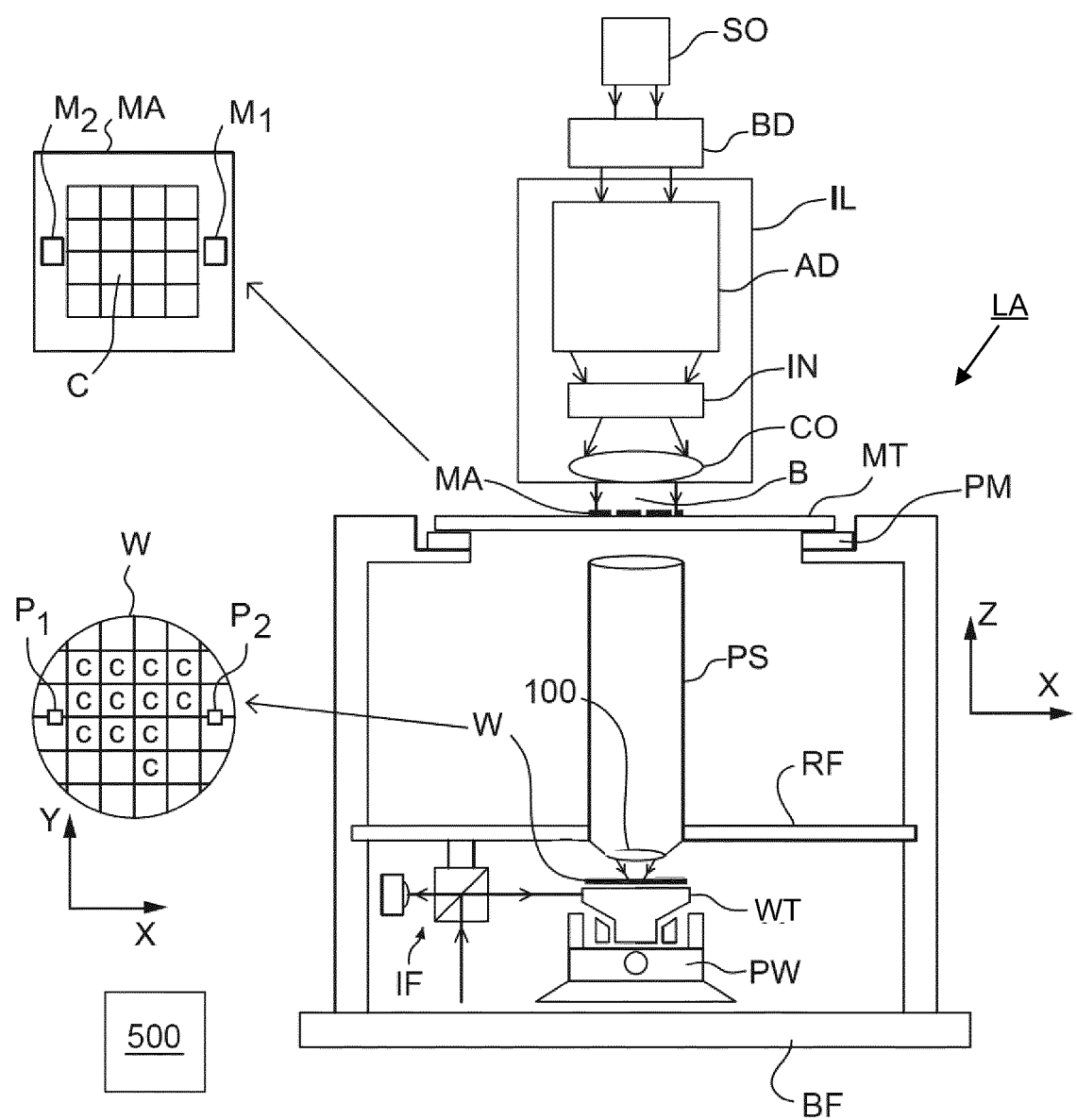
FIG. 1 depicts a lithographic apparatus.

FIG. 1 schematically depicts a lithographic apparatus LA. The apparatus includes an illumination system (illuminator) IL configured to condition a radiation beam B (e.g., UV radiation or DUV radiation), a support structure (e.g., a mask table) MT constructed to support a patterning device (e.g., a mask) MA and connected to a first positioner PM configured to accurately position the patterning device in accordance with certain parameters, a substrate table (e.g., a wafer table) WT constructed to hold a substrate (e.g., a resist coated wafer) W and connected to a second positioner PW configured to accurately position the substrate in accordance with certain parameters, and a projection system (e.g., a refractive projection lens system) PS configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic, or other types of optical components, or any combination thereof, for directing, shaping, or controlling radiation.

The support structure supports, i.e., bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing various types of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system."

In this embodiment, for example, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more substrate tables and, for example, two or more mask tables. In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (which are commonly referred to as G-outer and G-inner, respectively) of the intensity distribution in a pupil plane of the illuminator can be adjusted. In addition, the illuminator IL may comprise various other components, such as an integrator IN and a condenser CO. The illuminator may be used to condition the radiation beam to have a desired uniformity and intensity distribution in its cross section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g., an interferometric device, linear encoder, 2-D encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the mask MA with respect to the path of the radiation beam B, e.g., after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e., a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
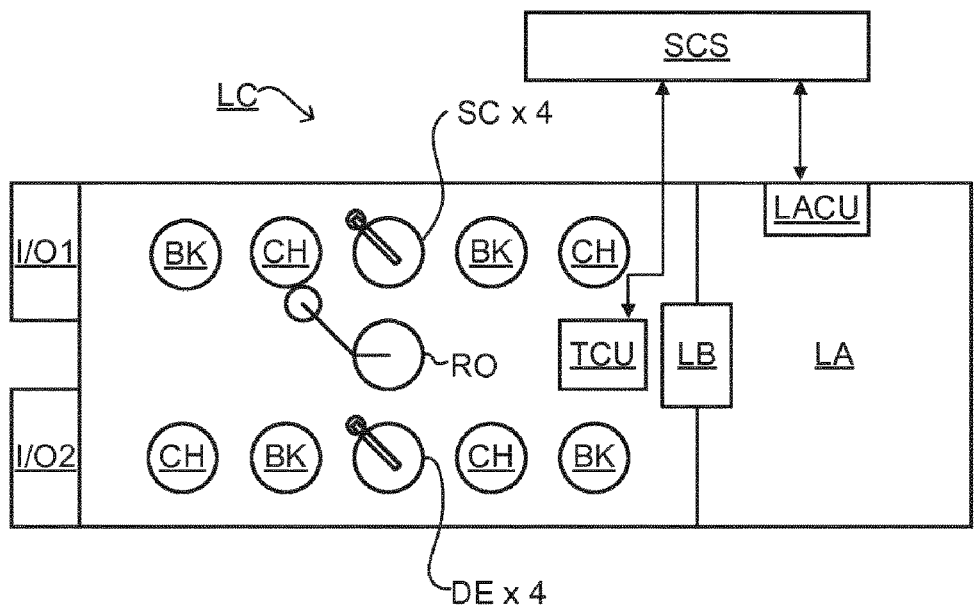
FIG. 2 depicts a lithographic cell or cluster.

As shown in FIG. 2 the lithographic apparatus LA forms part of a lithographic cell LC, also sometimes referred to as a lithocell or cluster, which also includes apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU that is itself controlled by the supervisory control system SCS, which also controls the lithographic apparatus via lithography control unit LACU. Thus, the different apparatus can be operated to maximize throughput and processing efficiency.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. If errors are detected, adjustments, for example, can be made to exposures of subsequent substrates, especially if the inspection can be done soon and fast enough that other substrates of the same batch are still to be exposed. Also, already exposed substrates may be stripped and reworked to improve yield, or possibly be discarded, thereby avoiding performing exposures on substrates that are known to be faulty. In a case where only some target portions of a substrate are faulty, further exposures can be performed only on those target portions that are deemed to be non-faulty.

An inspection apparatus, which may also be referred to as a metrology apparatus, is used to determine the properties of the substrates, and in particular, how the properties of different substrates or different layers of the same substrate vary from layer to layer. The inspection apparatus may be integrated into the lithographic apparatus LA or the lithocell LC or may be a stand-alone device. To enable most rapid measurements, it is desirable that the inspection apparatus measure properties in the exposed resist layer immediately after the exposure. However, the latent image in the resist has a very low contrast, as in there is only a very small difference in refractive index between the parts of the resist which have been exposed to radiation and those which have not—and not all inspection apparatus have sufficient sensitivity to make useful measurements of the latent image. Therefore measurements may be taken after the post-exposure bake step (PEB) that is customarily the first step carried out on exposed substrates and increases the contrast between exposed and unexposed parts of the resist. At this stage, the image in the resist may be referred to as semi-latent. It is also possible to make measurements of the developed resist image, at which point either the exposed or unexposed parts of the resist have been removed, or after a pattern transfer step such as etching. The latter possibility limits the possibilities for rework of faulty substrates but may still provide useful information.

Figure 3:
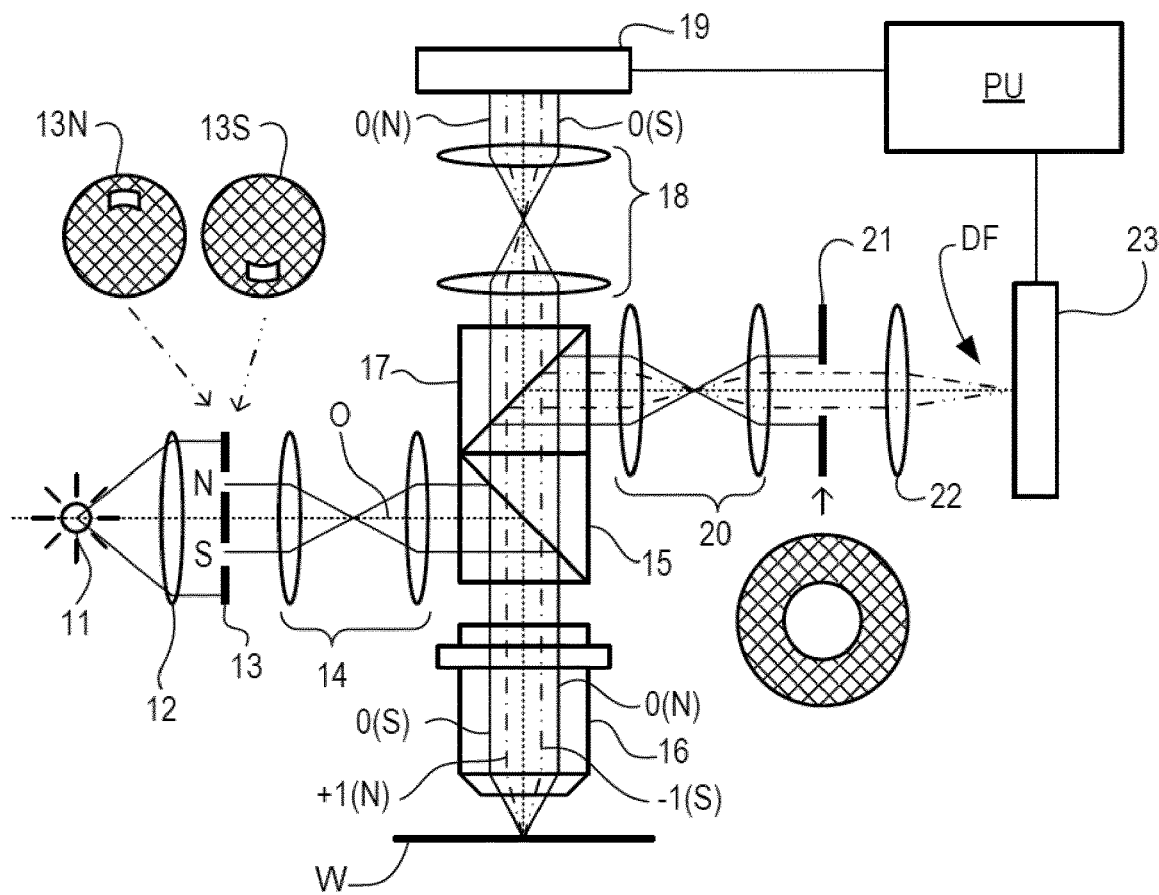
FIG. 3 depicts a scatterometer used in metrology.

FIG. 3 is a schematic diagram of an optical apparatus in the form of a scatterometer suitable for performing metrology in conjunction with the lithocell of FIG. 2. The apparatus may be used for measuring critical dimensions of features formed by lithography, measuring overlay between layers and the like. A product feature or dedicated metrology target is formed on substrate W. The apparatus may be a stand-alone device or incorporated in either the lithographic apparatus LA, e.g., at the measurement station, or the lithographic cell LC. An optical axis, which has several branches throughout the apparatus, is represented by a dotted line O. In this apparatus, light emitted by source 11 is directed onto substrate W via a beam splitter 15 by an optical system comprising lenses 12, 14 and objective lens 16. These lenses are arranged in a double sequence of a 4F arrangement. A different lens arrangement can be used, provided that it still provides an image of the source on the substrate, and simultaneously allows for access of an intermediate pupil-plane for spatial-frequency filtering. Therefore, the angular range at which the radiation is incident on the substrate can be selected by defining a spatial intensity distribution in a plane that presents the spatial spectrum of the substrate plane, here referred to as a (conjugate) pupil plane. In particular, this can be done by inserting an aperture plate 13 of suitable form between lenses 12 and 14, in a plane which is a back-projected image of the objective lens pupil plane. For example, as illustrated, aperture plate 13 can take different forms, two of which are labeled 13N and 13S, allowing different illumination modes to be selected. The illumination system in the illustrated example forms an off-axis illumination mode. In the first illumination mode, aperture plate 13N provides off-axis from a direction designated, for the sake of description only, as 'north'. In a second illumination mode, aperture plate 13S is used to provide similar illumination, but from an opposite direction, labeled 'south'. Other modes of illumination are possible by using different apertures. The rest of the pupil plane is desirably dark as any unnecessary light outside the desired illumination mode will interfere with the desired measurement signals.

At least the 0th and one of the −1 and +1 orders diffracted by the target on substrate W are collected by objective lens 16 and directed back through beam splitter 15. A second beam splitter 17 divides the diffracted beams into two measurement branches. In a first measurement branch, optical system 18 forms a diffraction spectrum (pupil plane image) of the target on first sensor 19 (e.g., a CCD or CMOS sensor) using the zeroth and first order diffractive beams. Each diffraction order hits a different point on the sensor, so that image processing can compare and contrast orders. The pupil plane image captured by sensor 19 can be used for focusing the metrology apparatus and/or normalizing intensity measurements of the first order beam. The pupil plane image can be used for many measurement purposes such as reconstruction.

In the second measurement branch, optical system 20, 22 forms an image of the target on the substrate W on sensor 23 (e.g., a CCD or CMOS sensor). In the second measurement branch, an aperture stop 21 is provided in a plane that is conjugate to the pupil-plane. Aperture stop 21 functions to block the zeroth order diffracted beam so that the image of the target formed on sensor 23 is formed only from the −1 or +1 first order beam. The image detected by sensor 23 is thus referred to as a 'dark-field' image. Note that the term 'image' is used here in a broad sense. An image of the grating lines as such will not be formed, if only one of the −1 and +1 orders is present.

The images captured by sensors 19 and 23 are output to image processor and controller PU, the function of which will depend on the particular type of measurements being performed.

Examples of scatterometers and techniques can be found in patent applications US 2006/066855 A1, WO 2009/078708, WO 2009/106279, and US 2011/0027704 A, which are all incorporated by reference herein in their entireties.

In the following, methods of measuring a parameter of a device manufacturing process, particularly of a lithographic process, according to embodiments are described. The methods are particularly applicable to measuring a parameter of a lithographic process comprising multiple patterning, for example double patterning or quadruple patterning. An example of a double patterning process using spacer patterning is described below with reference to FIGS. 4-9. Embodiments of the invention may also be applied where other forms of multiple patterning are used (spacer or non-spacer) and even in processes which do not involve multiple patterning.

Figure 4:
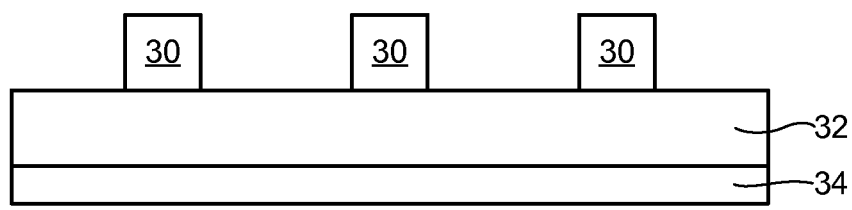
FIGS. 4-9 depict stages in an example double patterning process using spacer patterning.

FIG. 4 depicts a substrate 34. A base layer 32 is formed on the substrate 34. A patterned layer comprising a plurality of pre-patterned features 30 (e.g. lines), forming a first pattern, is formed on the base layer 32.

Figure 5:
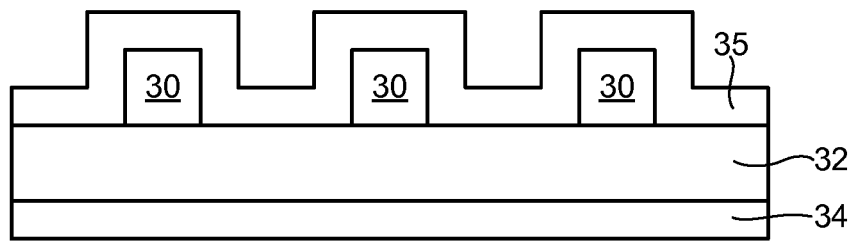

In a subsequent step, as depicted in FIG. 5, a film layer 35 is deposited onto the patterned layer.

Figure 6:
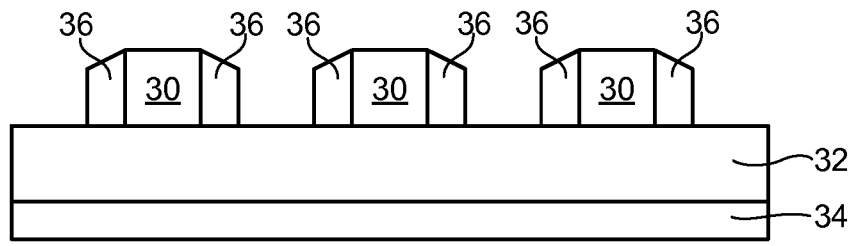

In a subsequent step, as depicted in FIG. 6, etching is performed to remove material from the film layer 35 on the horizontal surfaces. Layers 36 formed on sidewalls of the pre-patterned features 30 are left behind. The layers 36 may be referred to as spacers.

Figure 7:
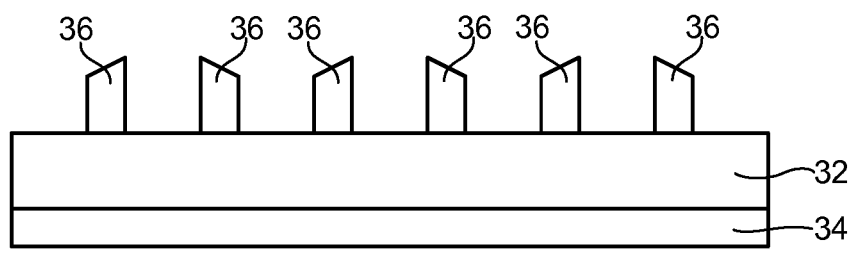

In a subsequent step, as depicted in FIG. 7, the pre-patterned features 30 are removed leaving the layers (spacers) 36 forming a pattern having twice the density of the original pattern of pre-patterned features 30 (because each of the pre-patterned features 30 had two sidewalls and each sidewall produces one of the layers (spacers) 36.

Figure 8:
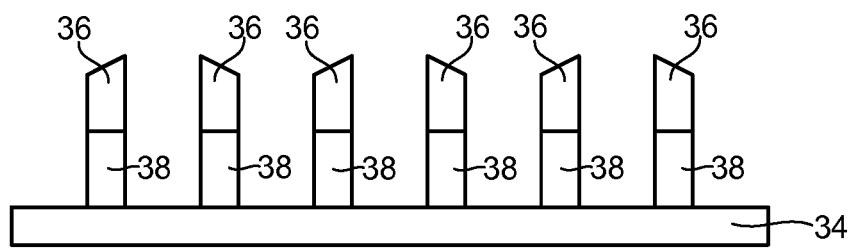

In a subsequent step, as depicted in FIG. 8, the layers (spacers) 36 are used as a mask to define selective etching of the base layer.

Figure 9:
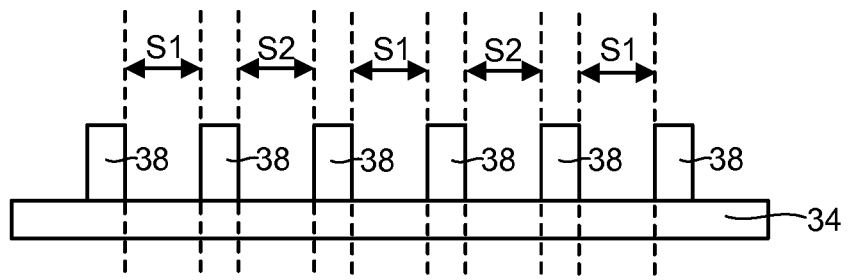

In a subsequent step, as depicting in FIG. 9, the layers (spacers) 36 are removed, leaving a second pattern of features 38 formed by the remaining material of the base layer. The second pattern (shown in FIG. 9) comprises twice as many features as the first pattern (shown in FIG. 4).

The process described above with reference to FIGS. 4-9 is sometimes referred to as Self-Aligned Double Patterning (SADP). The process can be repeated based on the features of the second pattern instead of the first pattern, thereby doubling the feature density a second time. This type of process is sometimes referred to as Self-Aligned Quadruple Patterning (SAQP). The process can in principle be repeated further to produce further increases in feature density.

Figure 10:
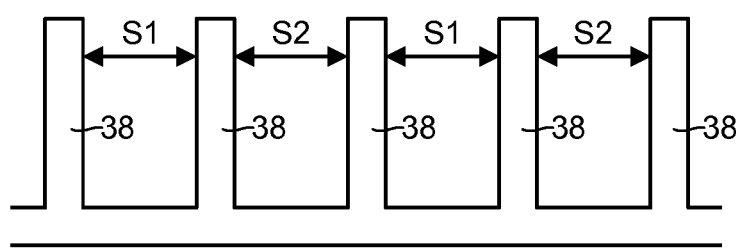
FIG. 10 depicts in schematic side section a periodic target structure formed by double patterning, with zero pitch walking.
Figure 11:
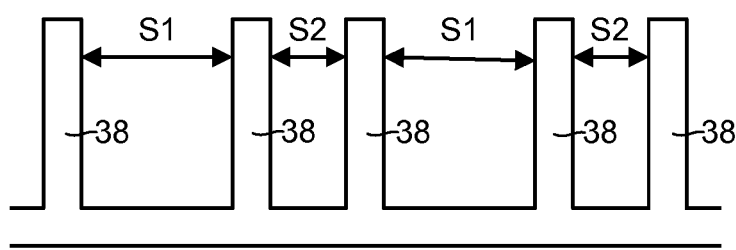
FIG. 11 depicts in schematic side section a periodic target structure formed by double patterning, with non-zero pitch walking.

Referring to FIG. 9, the separation distances S1 are determined by the width of the pre-patterned features 30. The separation distances S2 are determined by the separation distances between adjacent pairs of the pre-patterned features 30. A difference between S1 and S2 will result in an effective overlay error between odd and even features. The separation distance between adjacent features for non-zero S1-S2 will thus alternate. An alternating separation distance may be referred to as pitch walking. FIG. 10 depicts a portion of a structure with zero pitch walking (S1=S2). FIG. 11 depicts a portion of a structure with non-zero pitch walking (S1# S2). It is desirable to monitor and control any difference between S1 and S2 (e.g. to ensure the difference does not exceed a predetermined threshold).

Prior art techniques for measuring S1-S2 have various shortcomings.

Scanning electron microscopy (CD-SEM) has been used to measure S1-S2. Scanning electron microscopy is, however, relatively slow (typically requiring several seconds to make the measurement). CD-SEM measures with high localization on the device, meaning that a large number of inspection points are required to inspect the aggregate target performance. Furthermore, it is difficult to discriminate between S1 and S2.

Scatterometric techniques provide improved speed but can have low sensitivity, particularly for small values of S1-S2.

A method of measuring a parameter of a device manufacturing process (e.g. lithographic process) according to an embodiment is described below with reference to FIGS. 12-21. FIGS. 12, 13, 16, 17, 20 and 21 show example targets used in the method. The term "target" used herein should be broadly interpreted as referred to any structure that is used, or capable of being used, in a measurement process. A target may comprise a dedicated metrology target or a target may form part of a structure that is partially or completely provided for other purposes. A target may for example be formed from product features. The method comprises measuring a target 40 on a substrate W by illuminating the target 40 with measurement radiation and detecting the measurement radiation scattered by the target 40. Any of the methods disclosed may be implemented using an appropriately configured metrology apparatus. The metrology apparatus may comprise an optical apparatus as discussed above with reference to FIG. 3. A device manufacturing system comprising a device manufacturing apparatus and the metrology apparatus may be provided. The device manufacturing system may comprise a lithographic system comprising a lithographic apparatus and the metrology apparatus. The device manufacturing apparatus (e.g. lithographic apparatus) performs a device manufacturing process (e.g. lithographic process) on a substrate. The metrology apparatus measures a parameter of the device manufacturing process (e.g. lithographic process). The device manufacturing apparatus uses the parameter measured by the metrology apparatus in a subsequent device manufacturing process (e.g. lithographic process). Where the parameter represents an error in the device manufacturing process (e.g. lithographic process), the device manufacturing apparatus (e.g. lithographic apparatus) may use the parameter to reduce a size of the error.

The target 40 comprises a target structure having a first periodic component 42 and a second periodic component 44. In various embodiments, the first periodic component and the second periodic component are formed at different times, are formed using different lithographic processes, or both. In various embodiments, the first periodic component 42 is provided in a first layer and the second periodic component 44 is provided in a second layer, the second layer being above or below the first layer. In such embodiments, examples of which are shown in FIGS. 12, 13, 20 and 21, the structure in which the first periodic component 42 is provided may be referred to as a first layer target sub-structure. The structure in which the second periodic component 44 is provided may be referred to as a second layer target sub-structure. In other embodiments, the first periodic component 42 and the second periodic component 44 are provided in the same layer or are provided in layers that overlap with each other in a direction perpendicular to a plane of each of the layers. An example of such a target 40 is discussed below with reference to FIGS. 16 and 17.

Figure 12:
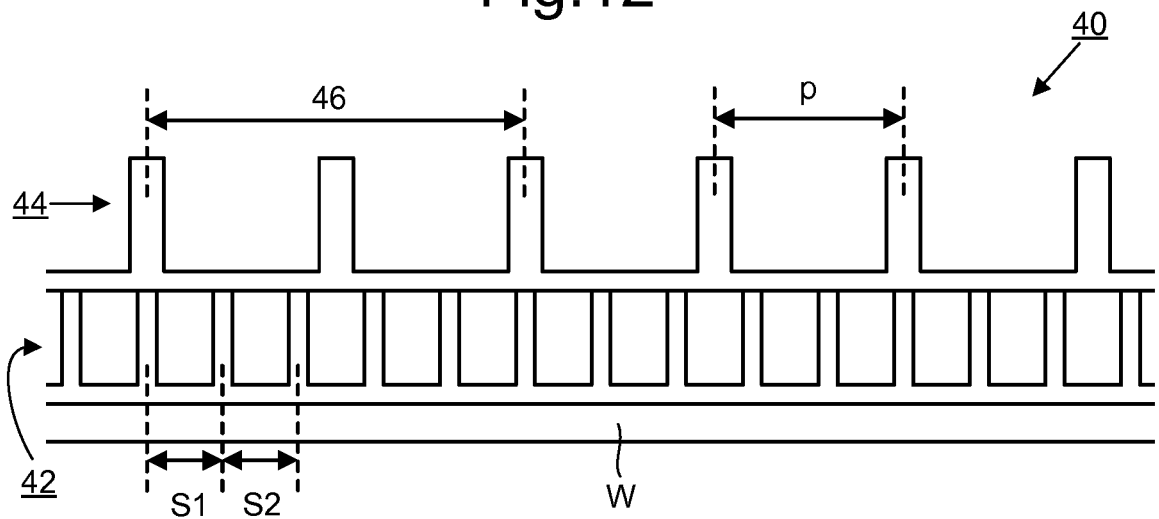
FIG. 12 depicts in schematic side section an example target comprising a target structure having a first periodic component in a first layer and a second periodic component in a second layer, wherein the first periodic component comprises zero pitch walking.
Figure 13:
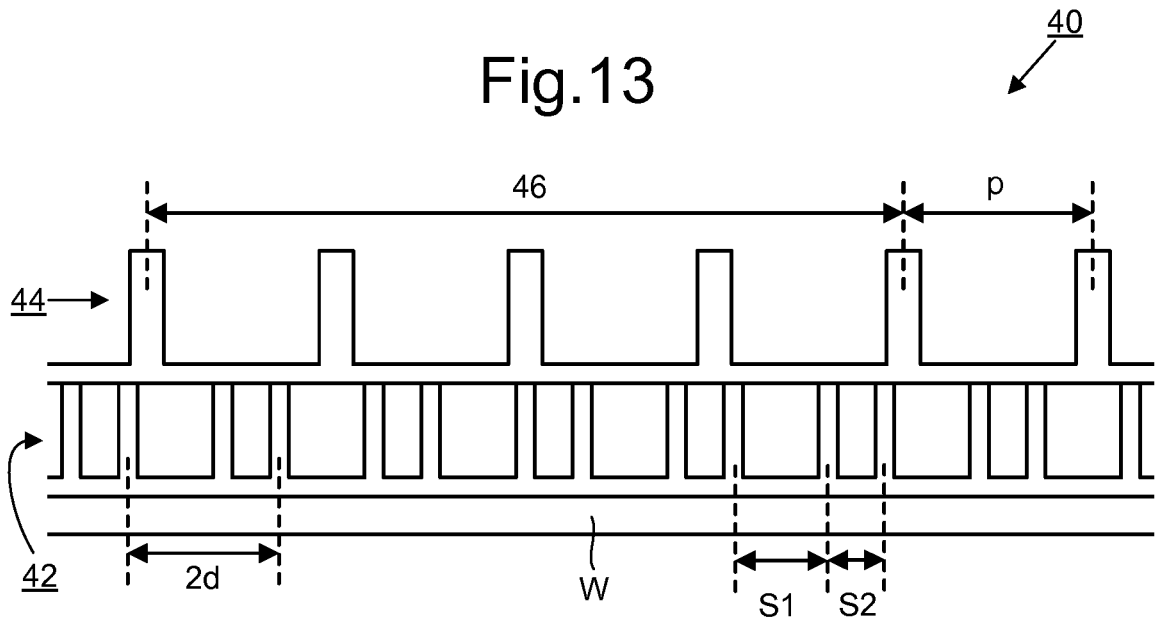
FIG. 13 depicts the target of FIG. 12 in the case where the first periodic component comprises non-zero pitch walking.
Figure 14:
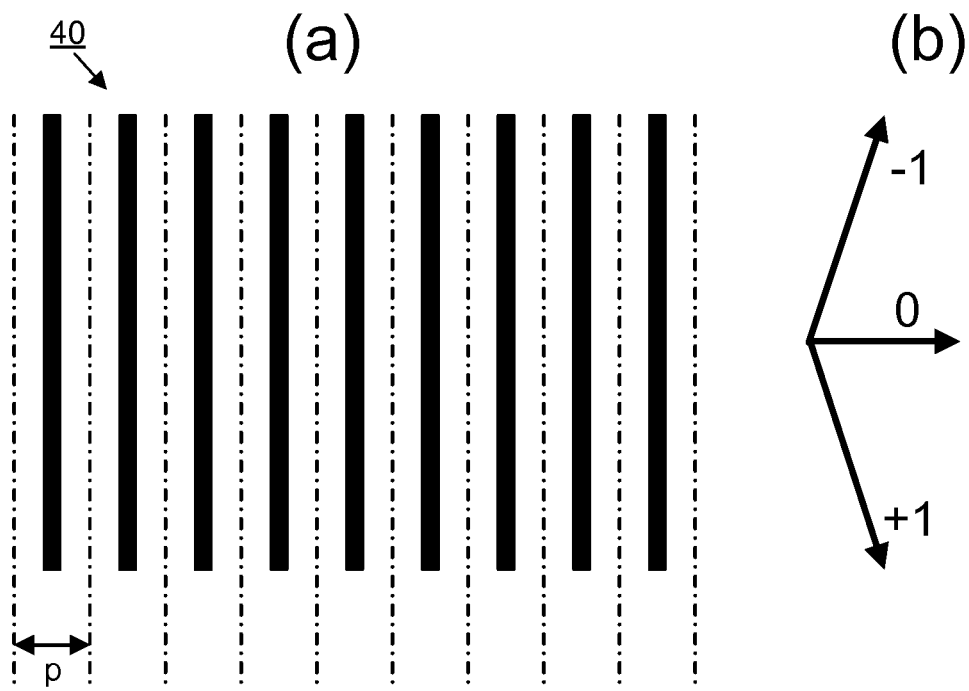
FIG. 14(a) is a schematic top view of a target structure having zero pitch walking.
FIG. 14(b) depicts first order diffraction from the target structure of FIG. 14(a) falling outside of an input to an optical apparatus.
Figure 15:
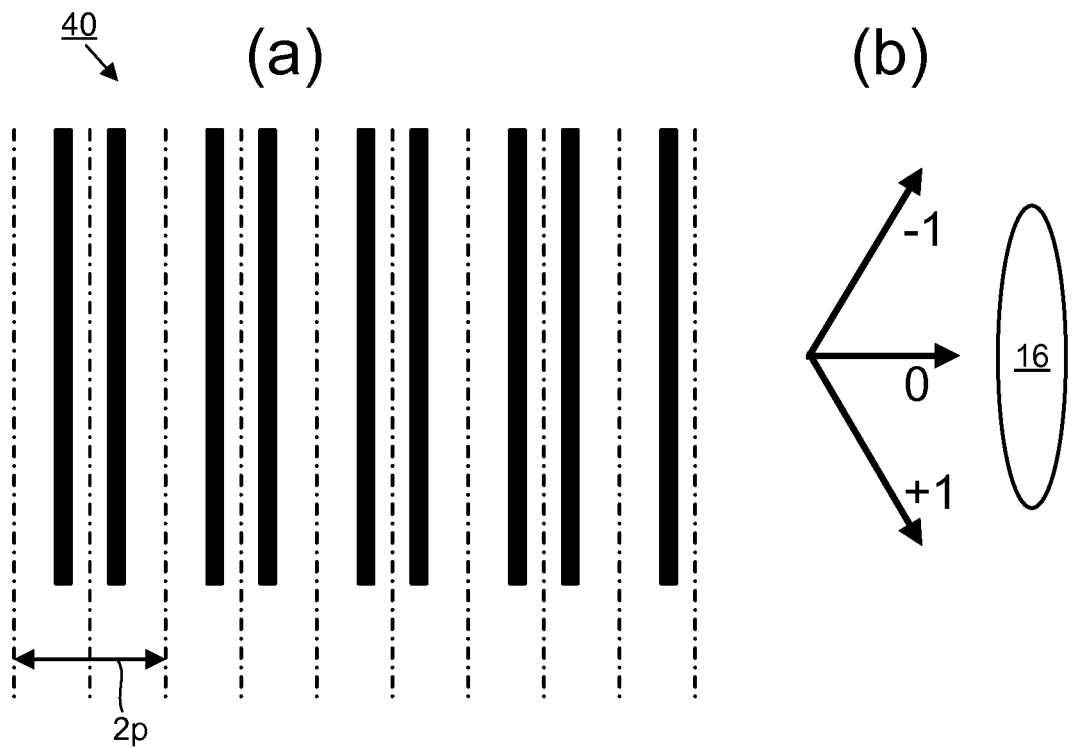
FIG. 15(a) is a schematic top view of the target structure of FIG. 14(a) in the case where pitch walking is non-zero.
FIG. 15(b) depicts first order diffraction from the target structure of FIG. 15(a) still falling outside of the input to the optical apparatus.

FIGS. 12 and 13 depict an embodiment in which the first periodic component 42 and the second periodic component 44 are provided in different layers. In this embodiment, the second periodic component 44 is provided on an upper side of the first periodic component 42. The upper side is defined as the side facing the incoming measurement radiation. In other embodiments the second periodic component 44 is provided below the first periodic component 42, but in such a way that the measurement radiation still interacts with both the first periodic component 42 and the second periodic component 44. The second periodic component 44 may be provided specifically to assist with monitoring a device manufacturing (e.g. lithographic) process. Alternatively, the second periodic component 44 may be provided for other reasons, for example as a layer forming part of a process chain in the manufacture of a product. In the latter case methods according to embodiments exploit the existence of the second periodic component 44 that is provided for other reasons to improve the measuring of a lithographic process being carried out in respect of a first periodic component 42 that is distinct from the second periodic component 44.

In embodiments where the first periodic component 42 and the second periodic component are provided in different layers relative to each other, the second periodic component 44 may be directly adjacent to the first periodic component 42, overlapping with the first periodic component 42 (in a direction perpendicular to the plane of the second periodic component) or separated from the first periodic component 42 by one or more intervening layers.

In an embodiment the first periodic component 42 is formed by a device manufacturing (e.g. lithographic) process to be monitored. The method measures a parameter of this process by measuring one or more properties of the first periodic component 42. The second periodic component 44 modifies measurement radiation scattered from the combination of the first periodic component 42 and the second periodic component 44 in such a way that information about the first periodic component 42 can be extracted more easily or with improved accuracy relative to the case where the second periodic component 44 is not provided and the measurement radiation is scattered from the first periodic component only. In an embodiment this is achieved by arranging the second periodic component 44 so that received radiation resulting from diffraction of the measurement radiation from the target structure comprises at least one diffraction order that would not be received from diffraction of the measurement radiation from the first periodic component 42 alone nor, preferably, from diffraction of the measurement radiation from the second periodic component 44 alone. This is achieved in various embodiments by arranging for a combined pitch of the first periodic component 42 and the second periodic component 44 to be longer than a pitch of the first periodic component 42 alone, preferably also longer than a pitch of the second periodic component 42 alone. Each pitch may represent a two dimensional periodicity or a three dimensional periodicity. Providing a combined pitch that is longer than a pitch of the first periodic component 42 alone (and/or second periodic component 44 alone) means that a diffraction pattern from the target will be less spread out relative to the case where the second periodic component 44 is not provided. Providing a diffraction pattern that is less spread out makes it possible to detect higher order components of the diffraction pattern more easily. Information about one or more parameters of interest may be more easily extractable from higher order components of the diffraction pattern than from lower order components of the diffraction pattern, for example because there is less influence from noise or geometrical factors which are not of interest. In an embodiment, the higher order component comprises a first order diffraction component. First order diffraction components are advantageously invariant with respect to geometrical variations such as spatial offset between the second periodic component 44 and the first periodic component 42, or line width variations in the second periodic component 44 pattern. The zeroth order diffraction component would be more influenced by such factors, thereby reducing signal to noise. The zeroth order diffraction component may also be less sensitive to a parameter of interest than higher order diffraction components.

Figure 23:
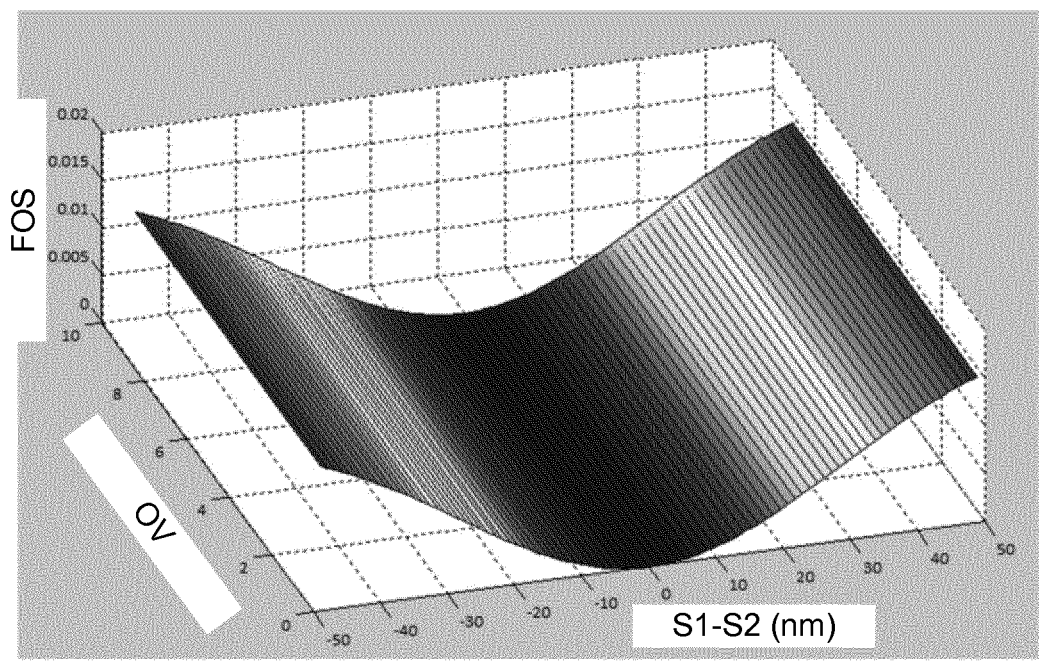
FIG. 23 is a graph depicting variation of a first order signal (FOS) as a function of overlay offset (OV) and separation deviation S1–S2.

The invariance of the first order diffraction component to overlay offset (OV) (i.e. offset between the second periodic component 44 and the first periodic component 42) is illustrated in the graph of FIG. 23. The graph shows that relatively large variations in overlay offset (OV) have negligible effect on how the first order diffraction component (first order signal, FOS) varies as a function of S1–S2.

FIGS. 14-17 illustrate application of the approach in the case of measuring pitch walking using a target having the first periodic component 42 and the second periodic component 44 in the same layer. FIGS. 18-21 illustrate application of the approach in the case of measuring an overlay error using a target having the first periodic component 42 and the second periodic component 44 in different layers.

In the arrangement of FIG. 14(a), a target 40 is provided that comprises a grating with pitch p. The pitch p is relatively small. The small pitch p means that first order diffraction beams generated from incident measurement radiation are therefore relative spread out, as shown in FIG. 14(b). The first order diffraction beams diffract at an angle that is too large to enter an input (e.g. objective lens 16) of an optical apparatus used to measure the scattered radiation, and are therefore effectively lost.

As shown in FIGS. 15(a) and 15(b), introducing pitch walking into the grating of FIG. 14(a) causes a pitch of the grating to increase to 2p. The increased pitch causes the first order diffraction to be less spread out but the angle is still too large for the first order radiation to enter the objective lens 16 (as shown in FIG. 15(b)).

FIG. 16(a) depicts a target 40 having a first periodic component 42 and a second periodic component 44. The first periodic component is the same as the grating of the target 40 of FIG. 14(a). The pitch of the first periodic component is therefore p. The second periodic component 44 comprises periodic regions in which a portion of the grating is removed. The periodic regions are depicted by broken line boxes in FIG. 16(a). The pitch of the second periodic component 44 (defined by the separation of the periodic regions) is 3p. The combined pitch 46 of the first periodic component 42 and the second periodic component 44 is also equal to 3p. The increased pitch relative to the arrangements of FIGS. 14 and 15 causes the first order diffraction to be even less spread out but the angle is still too large for the first order radiation to enter the objective lens 16 (as shown in FIG. 16(b)).

FIG. 17(a) depicts the target 40 of FIG. 16(a) in the case where pitch walking is present in the grating forming the first periodic component 42. The pitch walking increases the pitch of the first periodic component 42 to 2p (as in FIG. 15). The pitch walking also leads to an increase in the combined pitch 46 of the first periodic component 42 and the second periodic component 44 (from 3p to 6p). This embodiment is therefore an example of a class of embodiments in which a combined pitch of the first periodic component and the second periodic component is longer when pitch walking is present (which may be indicated by a deviation in the separation distances between features which are nominally spaced apart from each other by a common separation distance, as discussed above with reference to FIGS. 10-13) than when pitch walking (i.e. a deviation in the separation distances) is not present. The longer pitch finally brings the angle of diffraction of the first diffraction beams to a low enough value that the first diffraction beams enter the objective lens 16. The modification of the target 40 to incorporate the second periodic component 44 thereby makes it possible for the first order diffraction beams to be captured and contribute to a measurement of a parameter of the device manufacturing process (e.g. the size of the pitch walking).

In the arrangement of FIG. 18(a), a target 40 is provided that comprises a grating with pitch p. The grating provides a first periodic component 42. As in the arrangement of FIG. 14(a), the pitch p is relatively small and first order diffraction beams from the first periodic component 42 do not enter the objective lens 16 (FIG. 18(b)).

Figure 18:
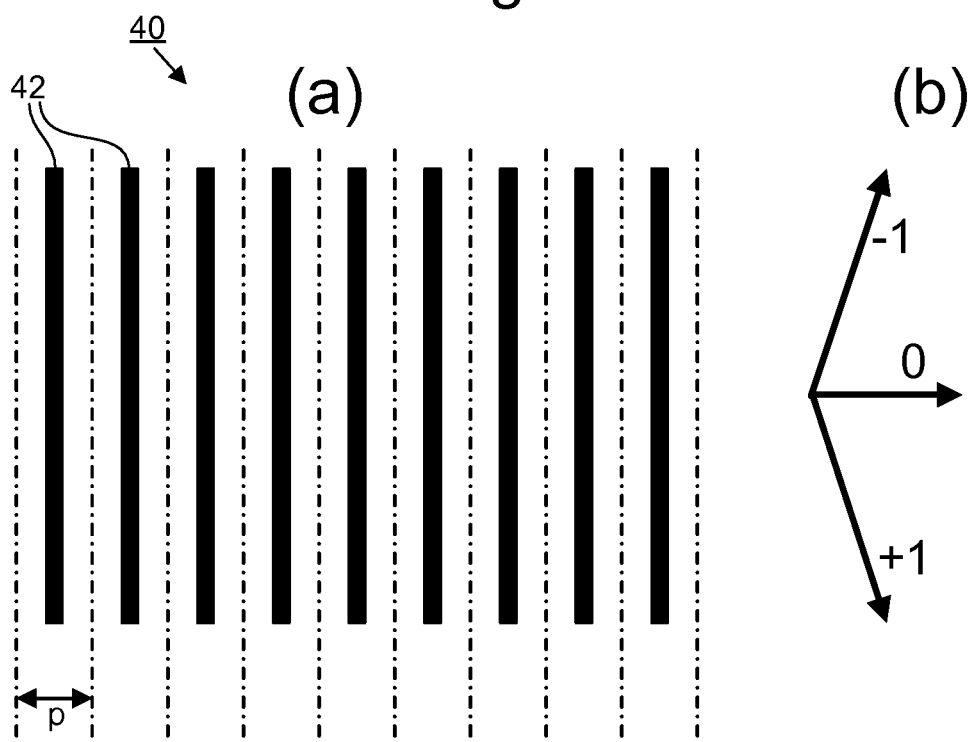
FIG. 18(a) is a schematic top view of a first periodic component in a first layer of a target.
FIG. 18(b) depicts first order diffraction from the first periodic component of FIG. 18(a) falling outside of the input to the optical apparatus.

FIGS. 19(a) and 19(b), show the target 40 of FIG. 18 with the addition of a second periodic component 44. The second periodic component 44 is provided by a grating having period 2p. The first and second periodic components 42,44 are provided in different layers relative to each other. The combined pitch of the first periodic component 42 and the second periodic component 44 is also equal to 2p. The increased pitch relative to the arrangement of FIG. 18 causes the first order diffraction to be less spread out but the angle is still too large for the first order radiation to enter the objective lens 16 (as shown in FIG. 19(b)).

Figure 19:
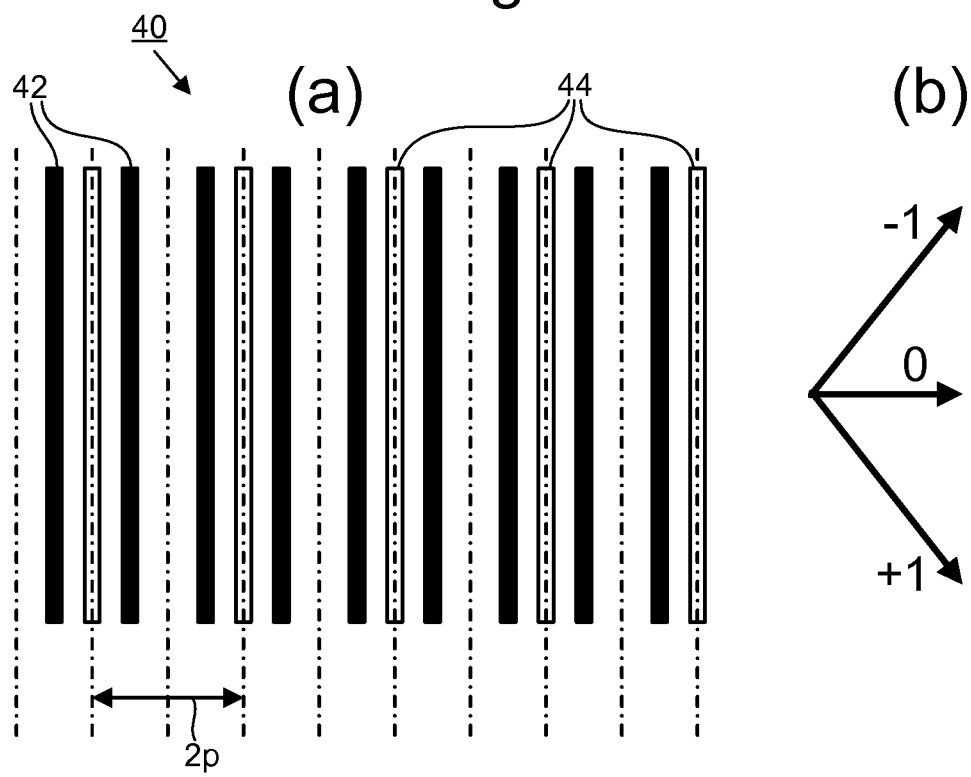
FIG. 19(a) is a schematic top view of a target comprising the first periodic component of FIG. 18(a) and a second periodic component formed in a second layer that is above or below the first layer, the second periodic component having a spatial period that is twice the spatial period of the first periodic component.
FIG. 19(b) depicts first order diffraction from the target of FIG. 19(a) falling outside of the input to the optical apparatus.

FIG. 20(a) depicts a target 40 where the first periodic component 42 has the same pitch p as the first periodic component 42 of FIG. 19 but the second periodic component 44 has a larger pitch 3p than the pitch of the second periodic component 44 of FIG. 19. The combined pitch 46 (equal to 6p) is large enough to cause the first order diffraction to enter the objective lens 16 (as depicted in FIG. 20(b)). The first order diffraction can therefore be captured and used to contribute to a measurement of a parameter of a device manufacturing process (e.g. overlay error). In the example shown, the first order diffraction is used to measure a parameter representing a degree of asymmetry in the target structure. The asymmetry in this example arises due to an overlay error between the first periodic component 42 in one layer and the second periodic component 44 in a different layer. The asymmetry results in a difference between opposite or different diffraction orders. In this example the difference is between the −1 and +1 diffraction orders.

Figure 20:
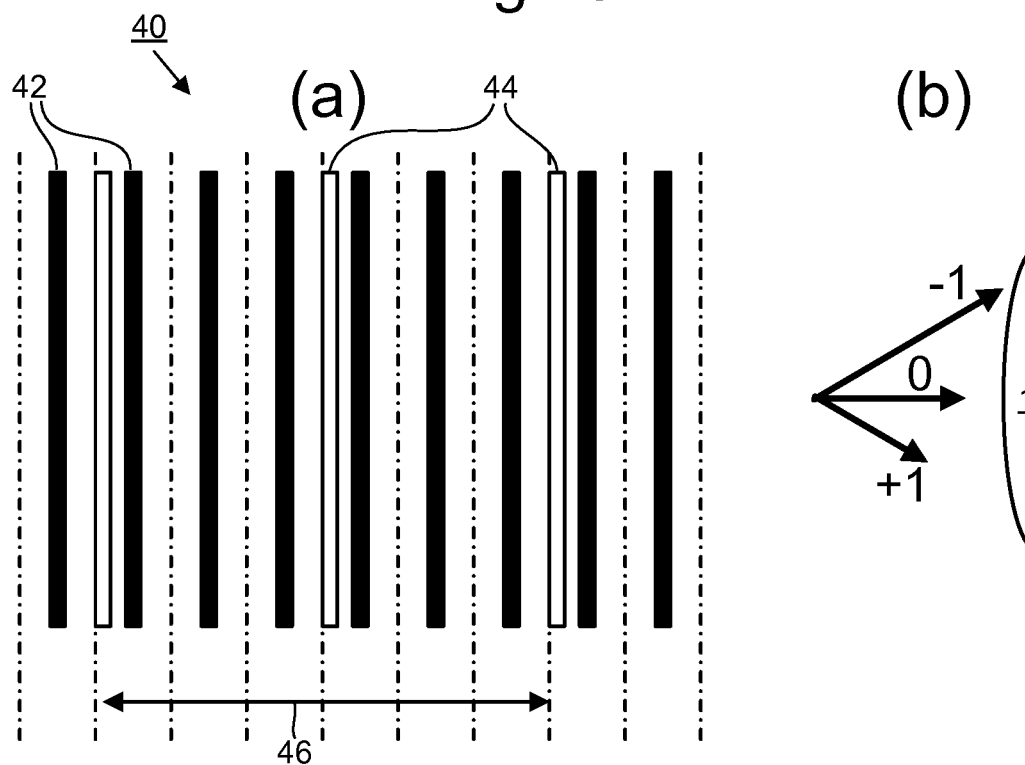
FIG. 20(a) is a schematic top view of the target of FIG. 19(a) except that the second periodic component has a spatial period that is three times the spatial period of the first periodic component and there is an overlay error between the first periodic component and the second periodic component leading to asymmetric diffraction.
FIG. 20(b) depicts asymmetric first order diffraction from the target of FIG. 20(a) falling within the input to the optical apparatus.
Figure 21:
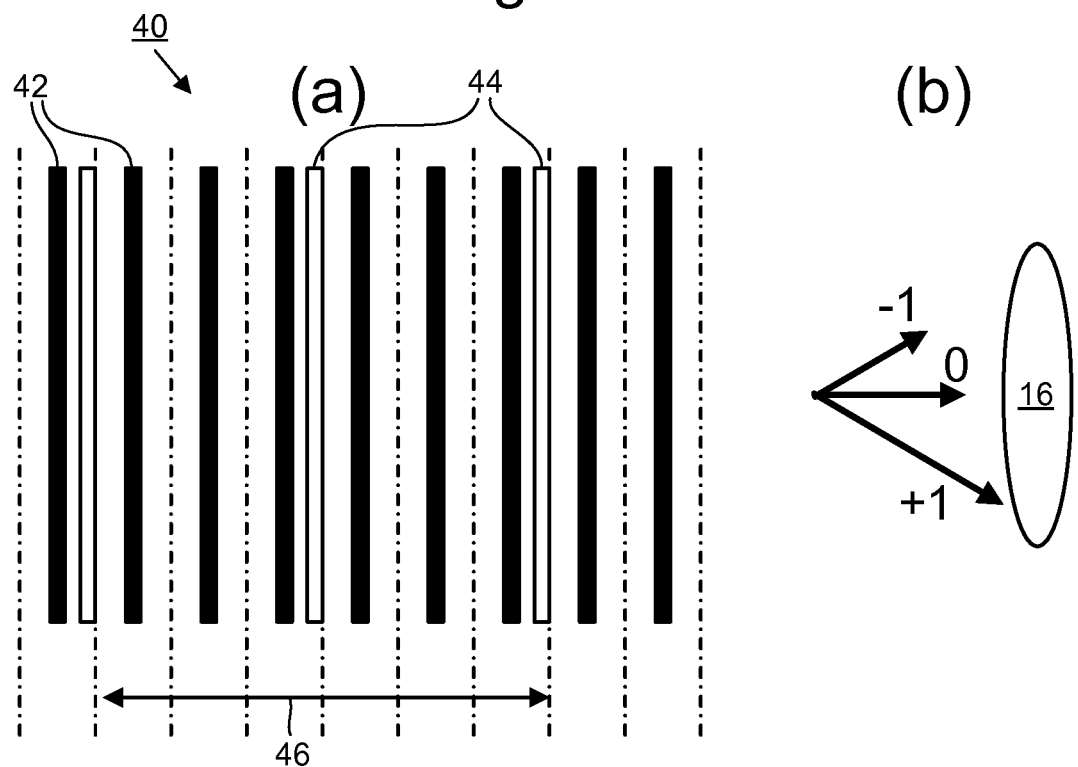
FIG. 21(a) is a schematic top view of the target of FIG. 20(a) except that there is a different overlay error between the first periodic component and the second periodic component.
FIG. 21(b) depicts asymmetric first order diffraction from the target of FIG. 21(a), the asymmetry being different from the asymmetry in the first order diffraction of FIG. 20(b)

FIG. 21(a) depicts the target 40 of FIG. 20 except that there is a different overlay error between the first periodic component 42 and the second periodic component 44. The different overlay error results in a different asymmetry between opposite or different diffraction orders (as can be seen by comparing FIGS. 20(b) and 21(b)).

In an embodiment, the first periodic component 42 is formed by multiple patterning. In an embodiment the first periodic component 42 is formed using a spacer patterning process such as the process described above with reference to FIGS. 4-9. In such an embodiment the first periodic component 42 is formed by one or more iterations of: forming a layer 36 on sidewalls of each feature 30 in a first pattern of features and, in a subsequent step, removing each feature 30 of the first pattern of features to form a second pattern having twice as many features 38 as the first pattern. In other embodiment, the first periodic component 42 is formed using a non-spacer multiple patterning process such as LELE.

In an embodiment, the first periodic component 42 is formed by a lithographic process configured to form three or more features that are nominally spaced apart from each other by a common separation distance (S1=S2). Thus, in the absence of any errors in the lithographic process, the separation between each and every pair of adjacent features will be identical. In practice, one or more errors in the lithographic process will cause a deviation in the separation distances (such that S1≠S2). The method comprises measuring the target 40 in order to measure a deviation in the separation distances caused by one or more errors in the lithographic process (including errors in etching processing for example).

In an embodiment, the deviation in the separation distances comprises a repeating sequence of different separation distances. Spacer patterning processes will produce a deviation in the separation distances of this type for example. In the case of double patterning, the repeating sequence of different separation distances comprises an alternating sequence of a first separation distance S1 and a second separation distance S2. This is referred to as pitch walking. FIG. 12 depicts a target 40 comprising a first periodic component 42 formed by double patterning with zero pitch walking (S1=S2). FIG. 13 depicts a target 40 comprising a first periodic component 42 formed by double patterning with non-zero pitch walking (S1# S2). Each separation distance S1 may be referred to as a first separation distance S1. Each separation distance S2 may be referred to as a second separation distance.

Figure 16:
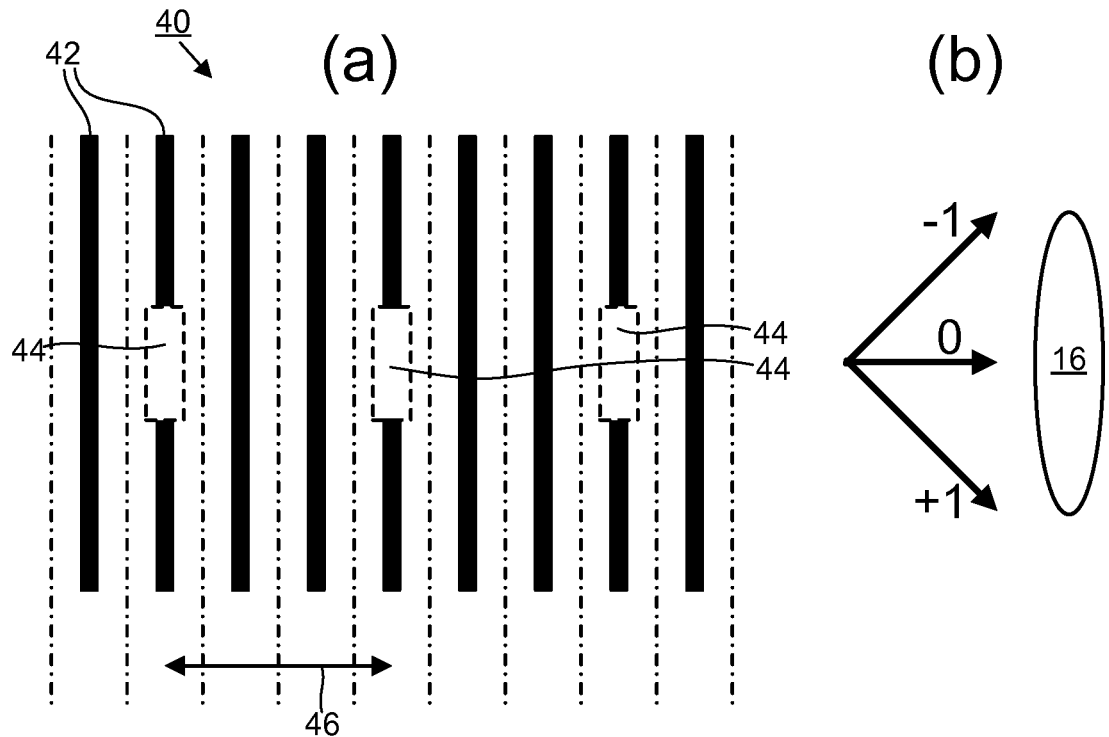
FIG. 16(a) is a schematic top view of a target structure having a first periodic component comprising a grating with zero pitching walking and a second periodic component comprising periodic regions in which a portion of the grating is removed.
FIG. 16(b) depicts first order diffraction from the target structure of FIG. 16(a) still falling outside of the input to the optical apparatus.
Figure 17:
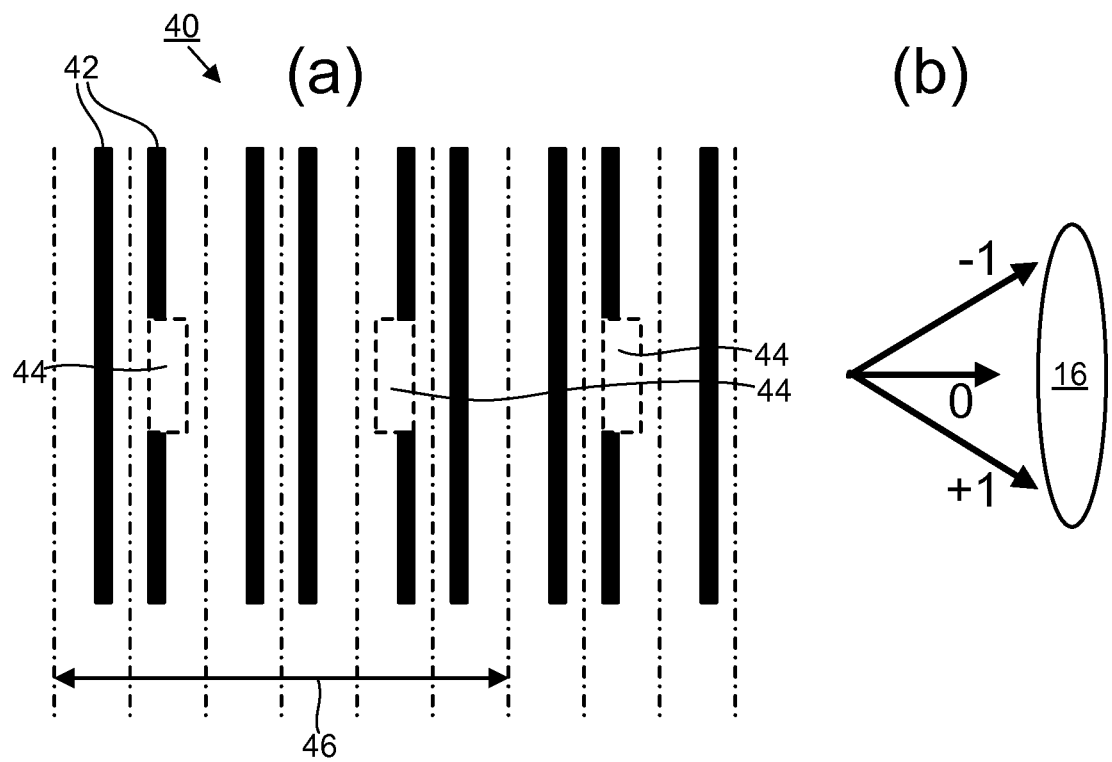
FIG. 17(a) is a schematic top view of a target structure having a first periodic component comprising a grating with non-zero pitching walking and a second periodic component comprising periodic regions in which a portion of the grating is removed.
FIG. 17(b) depicts first order diffraction from the target structure of FIG. 17(a) falling within the input to the optical apparatus.

In an embodiment, the second periodic component 44 comprises a periodic structure with a pitch p, the pitch p being selected such that the combined pitch of the first periodic component 42 and the second periodic component 44 is longer when a deviation in the separation distances is present than when a deviation in the separation distances is not present. The change in pitch caused by a deviation allows the deviation to be detected with high sensitivity. For example, the change in pitch can be used to cause a new higher order diffraction component to be detected when the change in pitch occurs (i.e. a higher order diffraction component which is too spread out to be detected by the optical system prior to the change in pitch). FIGS. 12, 13, 16 and 17 depict embodiments of this type. In FIG. 12 (zero pitch walking), the combined pitch 46 is equal to twice the pitch p of the second periodic component 44. In FIG. 13 (non-zero pitch walking), the combined pitch 46 doubles to four times the pitch p of the second periodic component 44. In FIG. 16 (zero pitch walking), the combined pitch 46 is equal to the pitch of the second periodic component 44. In FIG. 17, the combined pitch 46 is equal to twice the pitch of the second periodic component 44.

The second periodic component 44 of FIGS. 12 and 13 is an example of a class of second periodic components 44 in which a periodic structure is provided having a pitch p given by the following expression: $p=(n+\frac{1}{2})d$, where $d=(S1+S2)/2$, and n is a positive integer. Arranging for the pitch p to satisfy the above expression ensures that the combined pitch 46 of the first periodic component 42 and the second periodic component 44 is longer when a deviation in the separation distances is present than when a deviation in the separation distances is not present. In the particular example of FIGS. 12 and 13, n=2.

Figure 22:
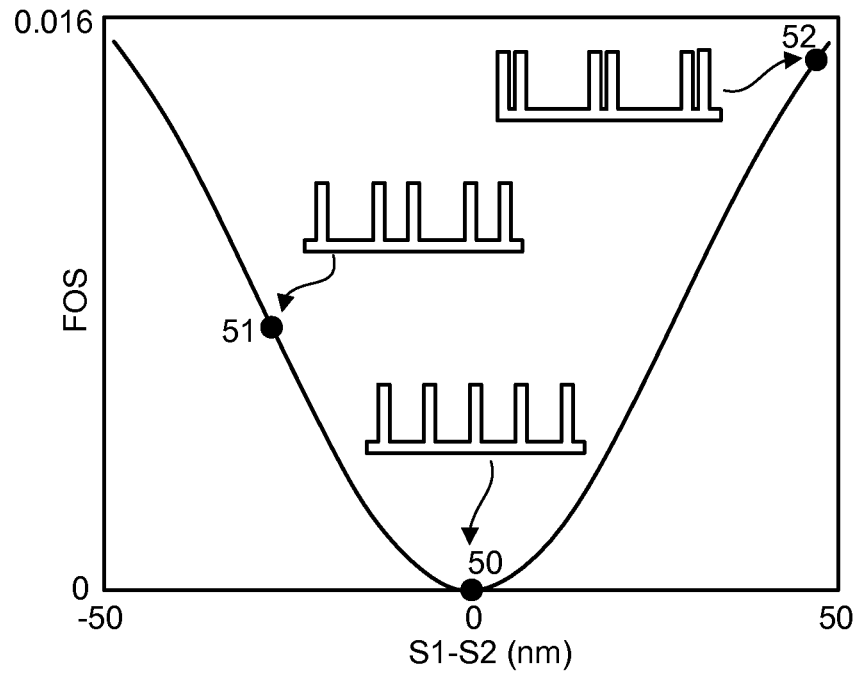
FIG. 22 is a graph depicting a variation of a first order signal (FOS) as a function of separation deviation S1–S2 and values for three different targets.

An example of an expected variation of a first order signal (FOS) against S1−S2 is shown in FIG. 22. The first order signal is a measurement of a first order diffraction component scattered from a target 40. Point 50 corresponds to a target 40 having a first periodic component 42 with zero pitch walking (see inset). Point 51 corresponds to a target 40 having a first periodic component 42 with intermediate non-zero pitch walking (see inset). Point 52 corresponds to a target 40 having a first periodic component 42 having relatively high non-zero pitch walking (see inset).

FIG. 22 shows that relatively high sensitivity is achieved for larger values of S1−S2 (indicated by relatively high steepness in the curve). The curve becomes flatter, however, for smaller values of S1−S2, indicating lower sensitivity. In an embodiment, sensitivity is improved by using two oppositely biased target structures to produce a differential signal. The biasing is selected so that an average sensitivity to small differences in S1−S2 caused by an error in the lithographic process is higher for the two target structures than for a single target structure without biasing. In an embodiment, a method is provided which comprises two steps.

The first step comprises measuring a first target structure comprising a first periodic component 42 formed by a process configured to form three or more features that are nominally spaced apart from each other by a common separation distance. The process is biased in a first sense so as nominally to form an alternating sequence of a first separation distance S1 and a second separation distance S2, wherein S1−S2=Δd. Thus, when performed perfectly the lithographic process will form a pattern with pitch walking exactly equal to the positive bias Δd. Deviations in the lithographic process will cause the pitch walking to be equal to the bias plus an error associated with the pitch walking introduced by the lithographic process.

The second step comprises measuring a second target structure comprising a first periodic component 42 formed by the same process as the process used to form the first periodic component 42 of the first target structure except that the process is biased in a second sense, opposite to the first sense. The process is thus configured to nominally form an alternating sequence of a first separation distance S1 and a second separation distance S2, wherein S1−S2=−Δd. Thus, when performed perfectly the lithographic process will form a pattern with pitch walking exactly equal to the negative bias Δd. Deviations in the lithographic process will cause the pitch walking to be equal to the negative bias plus an error associated with the pitch walking introduced by the lithographic process.

Figure 24:
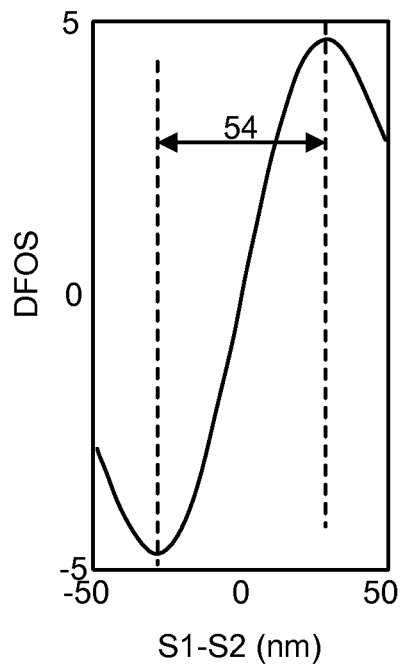
FIGS. 24 and 25 respectively show a variation of a derivative of a first order signal (DFOS) (proportional to sensitivity) and the first order signal (FOS) as a function of separation deviation S1–S2.
Figure 25:
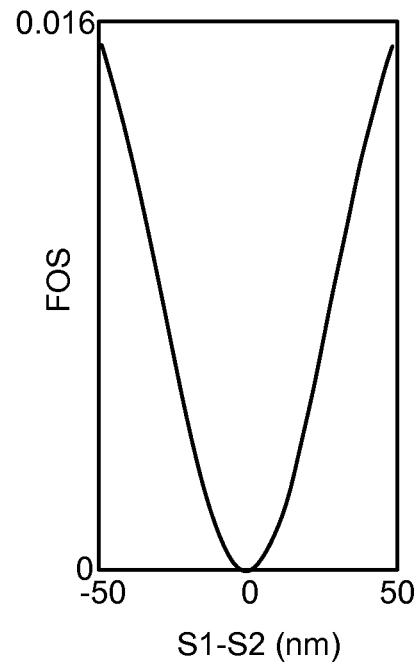

The variation of a derivative of the first order signal (DFOS) with respect to S1−S2 (which is proportional to sensitivity) as a function of S1−S2 is shown in FIG. 24 for the variation of first order signal (FOS) as a function of S1−S2 shown in FIG. 25. The graphs show that for biases Δd lying in the first period 54, sensitivity will be increased for small values of pitch walking caused by errors in the lithographic process (i.e. S1−S2 before biasing).

Figure 26:
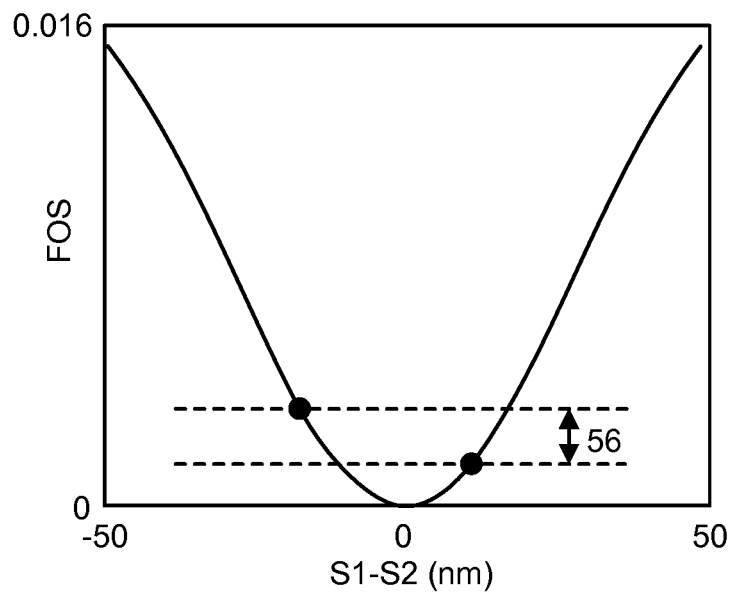
FIG. 26 is a graph depicting a variation of a first order signal (FOS) as a function of separation deviation S1–S2 and values for two oppositely biased target structures.

Forming a differential signal from the outputs of the first and second steps cancels out the deliberately applied biases +Δd and −Δd and allows the error associated with the pitch walking introduced by the lithographic process to be obtained with high sensitivity. In typical embodiments the difference between the signals from each of the two oppositely biased targets will be a linear function of an average value of S1–S2 (before biasing), although it is also possible to arrange for the variation to be non-linear. FIG. 26 depicts example points for measurements performed on two oppositely biased target structures using a lithographic process with a small pitch walking error. Both signals are located on relatively steep parts of the curve of FOS against S1–S2 and are therefore both relatively sensitive to any change in S1–S2 caused by one or more errors in the lithographic process. The difference 56 between the two signals is proportional to the S1–S2 caused by the lithographic process (without biasing).

In an embodiment, the method is adapted to allow simultaneous measurement of 1) overlay offset between the second periodic component 44 and the first periodic component 42, and 2) a deviation in the separation distances between nominally equally spaced features in the target structure (e.g. S1–S2). In an embodiment, the method comprises illuminating the target 40 with measurement radiation in a first band centered at a first wavelength and illuminating the target with measurement radiation in a second band centered at a second wavelength. The illumination with measurement radiation in the first band and the second band may be performed simultaneously or at different times. In an embodiment, the first wavelength is in the range of 650-750 nm, optionally about 700 nm, and the second wavelength is in the range of 400-450 nm, optionally about 425 nm. In this method the detected measurement radiation of the second band resulting from diffraction from the target structure is on average from higher order diffraction than the detected measurement radiation of the first band resulting from diffraction from the target structure.

In an embodiment, the detected measurement radiation of the first band resulting from higher than zeroth order diffraction from the target structure is predominantly from first order diffraction. The detected measurement radiation of the second band resulting from higher than zeroth order diffraction from the target structure comprises radiation from second order diffraction.

Figure 27:
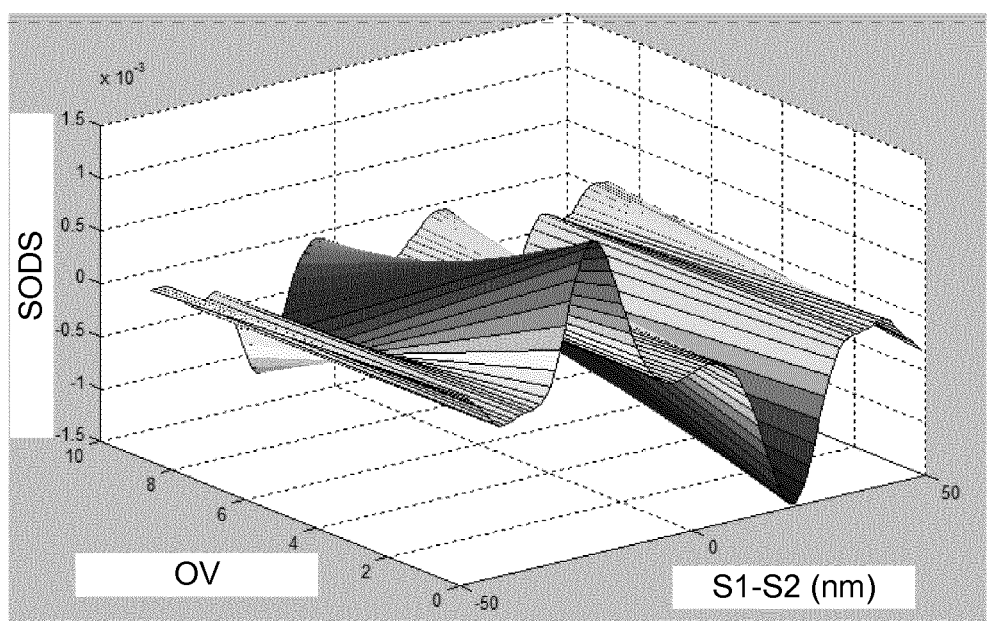
FIG. 27 is a graph depicting variation of a second order differential signal (SODS) as a function of overlay offset (OV) and separation deviation S1–S2.

The inventors have found that the first order diffracted radiation is sensitive to a deviation in the separation distances (e.g. S1–S2) between nominally equally spaced features (e.g. pitch walking) and is substantially independent of variations in overlay offset (OV) between the second periodic component 44 and the first periodic component 42. Example behavior of this type is depicted in FIG. 23 and discussed above. The inventors have further found that the second order diffracted radiation is sensitive both to a deviation in the separation distances (e.g. S1–S2) between nominally equally spaced features (e.g. pitch walking) and variations in overlay offset (OV) between the second periodic component 44 and the first periodic component 42. Example behaviour of this type is depicted in FIG. 27. In contrast to FIG. 23, where the signal (vertical axis) does not vary substantially with overlay offset (OV) at any fixed value of S1–S2, FIG. 27 shows that a second order differential signal (SODS), which corresponds to a differential measurement using second order diffracted radiation scattered from oppositely biased target structures, does vary substantially with overlay offset (OV) for most fixed values of S1–S2. The second order signal (SODS) also varies significantly with S1–S2 for most fixed values of overlay offset (OV).

In accordance with the above, in an embodiment in which the first periodic component 42 is formed by a process configured to form three or more features that are nominally spaced apart from each other by a common separation distance, detected measurement radiation of the first band is used to measure a deviation in the separation distances (e.g. S1–S2) caused by one or more errors in the process. Detected measurement radiation of the second band is used to measure a combination of 1) the deviation in the separation distances (e.g. S1–S2) caused by one or more errors in the process; and 2) an overlay offset between the first periodic component 42 and the second periodic component 44 caused by one or more errors in the process. The overlay offset (OV) between the first periodic component 42 and the second periodic component 44 can then be obtained using the detected measurement radiation of the second band and the deviation in the separation distances (e.g. S1–S2) measured using the detected measurement radiation of the first band. The method thereby allows both a deviation in the separation distances (e.g. S1–S2) and overlay offset (OV) to be independently obtained in an accurate and efficient manner from the same target 40 (or group of targets, for example pair of targets 40). As discussed above, sensitivity can be improved using one or more pairs of oppositely biased target structures.

In an embodiment, the method comprises measuring a first target structure comprising a first periodic component formed by a process configured to form three or more features that are nominally spaced apart from each other by a common separation distance. The process is biased in a first sense so as nominally to form an alternating sequence of a first separation distance S1 and a second separation distance S2, wherein S1–S2=$\Delta$d. $\Delta$d is selected so that a sensitivity of a measurement of an overlay error between the first periodic component 42 and the second periodic component 44 using the detected measurement radiation of the second band is greater than when S1–S2=0.

In an embodiment, the method further comprises measuring a second target structure comprising a first periodic component 42 formed by the same process as the process used to form the first periodic component 42 of the first target structure except that the process is biased in a second sense, opposite to the first sense, so as nominally to form an alternating sequence of a first separation distance S1 and a second separation distance S2, wherein S1–S2=–$\Delta$d. In this manner a differential signal can be obtained in which the bias $\Delta$d cancels out. Variation of such a signal (SODS) against overlay offset and S1–S2 is depicted in FIG. 27.

FIG. 27 depicts how the sensitivity of the overlay offset varies as a function of S1–S2 (as indicated by the variation in the steepness of the curve in directions parallel to the overlay offset (OV) axis). By selecting a bias $\Delta$d which corresponds to a steep part of the curve in the direction parallel to the overlay offset (OV) axis, it is possible to achieve high sensitivity in the measurement of overlay offset (OV).

In an embodiment, the method comprises measuring or estimating the sensitivity of the measurement of an overlay error between the first periodic component 42 and the second periodic component 44 for a plurality of different values of $\Delta$d. In a subsequent step the overlay error is measured using a target structure having a value of $\Delta$d selected based on the measured or estimated sensitivities (e.g. so as to achieve a relative high sensitivity).

In an embodiment, the method comprises, for a plurality of different values of $\Delta$d: 1) measuring or estimating the sensitivity of the measurement of an overlay error between the first periodic component 42 and the second periodic component 44; and 2) measuring or estimated the sensitivity of the measurement of a deviation in the separation distances (e.g. S1–S). The method of this embodiment further comprises measuring the overlay offset and the deviation in the separation distances using a target structure having a value of Δd selected based on the sensitivities measured or estimated in steps (1) and (2) (e.g. so as to achieve a desirable balance of sensitivities for both of the measurements of overlay offset and the deviation in the separation distances).

The embodiments may further be described using the following clauses

1. A method of measuring a parameter of a device manufacturing process, the method comprising:

measuring a target on a substrate by illuminating the target with measurement radiation and using an optical apparatus to detect the measurement radiation scattered by the target, wherein:

the target comprises a target structure having a first periodic component and a second periodic component; and the optical apparatus receives radiation resulting from diffraction of the measurement radiation from the target structure, the received radiation comprising at least one diffraction order that would not be received from diffraction of the measurement radiation from the first periodic component alone nor from diffraction of the measurement radiation from the second periodic component alone.

2. The method of clause 1, wherein a combined pitch of the first periodic component and the second periodic component is longer than a pitch of the first periodic component alone and longer than a pitch of the second periodic component alone.

3. The method of clause 1 or 2, wherein the first periodic component and the second periodic component are provided in the same layer or are provided in layers that overlap with each other in a direction perpendicular to a plane of each of the layers.

4. The method of clause 3, wherein the first periodic component comprises a grating and the second periodic component comprises periodic regions in which a portion of the grating is removed.

5. The method of clause 1 or 2, wherein the first periodic component is provided in a first layer and the second periodic component is provided in a second layer, the second layer being above or below the first layer.

6. The method of any preceding clause, wherein the first periodic component and the second periodic component are formed at different times, are formed using different lithographic processes, or both.

7. The method of any preceding clause, wherein the radiation received by the optical apparatus is used to measure a parameter representing a degree of asymmetry in the target structure, the asymmetry resulting in a difference between opposite or different diffraction orders in measurement radiation diffracted from the target structure.

8. The method of any preceding clause, wherein:

the first periodic component is formed by a process configured to form three or more features that are nominally spaced apart from each other by a common separation distance; and the method comprises measuring the target structure to obtain a deviation in the separation distances caused by one or more errors in the process.

9. The method of clause 8, wherein a combined pitch of the first periodic component and the second periodic component is longer when a deviation in the separation distances is present than when a deviation in the separation distances is not present.

10. The method of clause 9, wherein the measuring of the target is such that a predetermined higher order diffraction component is detected when the combined pitch is longer due to the presence of a deviation in the separation distances than when the combined pitch is not longer because a deviation in the separation distances is not present.

11. The method of clause 10, wherein the deviation in the separation distances comprises a repeating sequence of different separation distances.

12. The method of clause 11, wherein the repeating sequence of different separation distances comprises an alternating sequence of a first separation distance S1 and a second separation distance S2.

13. The method of clause 12, wherein the second periodic component has a pitch, p, given by the following expression: $p=(n+\frac{1}{2})d$, where $d=(S1+S2)/2$, and n is an integer.

14. The method of any preceding clause, wherein:

the target comprises a first of the target structures and a second of the target structures;

the first of the target structures comprises a first periodic component formed by a process configured to form three or more features that are nominally spaced apart from each other by a common separation distance, wherein the process is biased in a first sense so as nominally to form an alternating sequence of a first separation distance S1 and a second separation distance S2, wherein S1−S2=Δd; and the second of the target structures comprises a first periodic component formed by the same process as the process used to form the first periodic component of the first of the target structures, except that the process is biased in a second sense, opposite to the first sense, so as nominally to form an alternating sequence of a first separation distance S1 and a second separation distance S2, wherein S1−S2=−Δd.

15. The method of any preceding clause, wherein the first periodic component is formed by multiple patterning.

16. The method of any preceding clause, wherein:

the illuminating of the target with measurement radiation comprises illuminating the target with measurement radiation in a first band centered at a first wavelength and illuminating the target with measurement radiation in a second band centered at a second wavelength; and the detected measurement radiation of the second band resulting from diffraction from the target structure is on average from higher order diffraction than the detected measurement radiation of the first band resulting from diffraction from the target structure.

17. The method of clause 16, wherein:

the detected measurement radiation of the first band resulting from higher than zeroth order diffraction from the target structure is predominantly from first order diffraction; and the detected measurement radiation of the second band resulting from higher than zeroth order diffraction from the target structure comprises radiation from second order diffraction.

18. The method of clause 16 or 17, wherein the first periodic component is formed by a process configured to form three or more features that are nominally spaced apart from each other by a common separation distance;

the detected measurement radiation of the first band is used to measure a deviation in the separation distances cause by one or more errors in the process; and the detected measurement radiation of the second band is used to measure a combination of 1) the deviation in the separation distances caused by one or more errors in the process; and 2) an overlay offset between the first periodic component and the second periodic component caused by one or more errors in the process.

19. The method of clause 18, comprising obtaining the overlay offset between the first periodic component and the second periodic component using the detected measurement radiation of the second band and the deviation in the separation distances measured using the detected measurement radiation of the first band.

20. The method of clause 18 or 19, wherein the method comprises:
measuring a first of the target structures comprising a first periodic component formed by a process configured to form three or more features that are nominally spaced apart from each other by a common separation distance, wherein the process is biased in a first sense so as nominally to form an alternating sequence of a first separation distance S1 and a second separation distance S2, wherein S1−S2=Δd; and
Δd is selected so that a sensitivity of a measurement of an overlay error between the first periodic component and the second periodic component using the detected measurement radiation of the second band is greater than when S1−S2=0.

21. The method of clause 20, further comprising:
measuring a second of the target structures comprising a first periodic component formed by the same process as the process used to form the first periodic component of the first of the target structures, except that the process is biased in a second sense, opposite to the first sense, so as nominally to form an alternating sequence of a first separation distance S1 and a second separation distance S2, wherein S1−S2=−Δd.

22. The method of clause 20 or 21, comprising:
measuring or estimating the sensitivity of the measurement of an overlay error between the first periodic structure and the second periodic structure for a plurality of different values of Δd; and measuring the overlay error using a target structure having a value of Δd selected based on the measured or estimated sensitivities.

23. The method of clause 20 or 21, comprising:
for a plurality of different values of Δd: 1) measuring or estimating the sensitivity of the measurement of an overlay error between the first periodic component and the second periodic component; and 2) measuring or estimating the sensitivity of a measurement of a deviation in the separation distances; and
measuring the overlay offset and the deviation in the separation distances using a target structure having a value of Δd selected based on the sensitivities measured or estimated in steps (1) and (2).

24. A metrology apparatus configured to perform the method of any preceding clause.

25. A substrate comprising a target for use in measuring a parameter of a device manufacturing process by illuminating the target with measurement radiation and detecting measurement radiation scattered by the target, wherein:
the target comprises a target structure having a first periodic component and a second periodic component;
the first periodic component is provided in a first layer and the second periodic component is provided in a second layer, the second layer being above or below the first layer; and
the second periodic component is configured so that a combined pitch of the first periodic component and the second periodic component is longer than a pitch of the first periodic component alone and longer than a pitch of the second periodic component alone.

26. A target for use in device manufacturing in a measuring process, wherein:
the target comprises a target structure having a first periodic component and a second periodic component;
the first periodic component is provided in a first layer and the second periodic component is provided in a second layer, the second layer being above or below the first layer; and
the second periodic component is configured so that a combined pitch of the first periodic component and the second periodic component is longer than a pitch of the first periodic component alone and longer than a pitch of the second periodic component alone.

27. A metrology apparatus for measuring a parameter of a device manufacturing process, the metrology apparatus comprising:
a substrate comprising a target; and
an optical apparatus for measuring the target by illuminating the target with measurement radiation and detecting the measurement radiation scattered by the target, wherein:
the target comprises a target structure having a first periodic component and a second periodic component; and
the optical apparatus is configured to receive radiation resulting from diffraction of the measurement radiation from the target structure, the received radiation comprising at least one diffraction order that would not be received from diffraction of the measurement radiation from the first periodic component alone nor from diffraction of the measurement radiation from the second periodic component alone.

28. A device manufacturing system comprising:
a device manufacturing apparatus configured to perform a device manufacturing process on a substrate; and
the metrology apparatus of clause 27 configured to measure a parameter of the device manufacturing process, wherein:
the device manufacturing apparatus is configured to use a parameter measured by the metrology apparatus in a subsequent device manufacturing process.

29. A device manufacturing method, comprising:
performing a device manufacturing process on a substrate;
using the method of any of clauses 1 to 23 to measure a parameter of the device manufacturing process; and
using the measured parameter to modify a performing of a subsequent device manufacturing process.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), soft X-ray, as well as particle beams, such as ion beams or electron beams.

The term "lens," where the context allows, may refer to any one or combination of various types of optical components, including refractive, reflective, magnetic, electromagnetic, and electrostatic optical components.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A method of measuring a parameter of a device manufacturing process, the method comprising:
    measuring a target on a substrate by illuminating the target with measurement radiation and using an optical apparatus to detect the measurement radiation scattered by the target, wherein:
    the target comprises a target structure having a first periodic component and a second periodic component; and
    the optical apparatus is configured to receive radiation resulting from diffraction of the measurement radiation from the target structure, the received radiation comprising at least one diffraction order that would not be received from diffraction of the measurement radiation from the first periodic component alone nor from diffraction of the measurement radiation from the second periodic component alone.

2. The method of claim 1, wherein a combined pitch of the first periodic component and the second periodic component is longer than a pitch of the first periodic component alone and longer than a pitch of the second periodic component alone.

3. The method of claim 1, wherein the first periodic component and the second periodic component are provided in the same layer or are provided in layers that overlap with each other in a direction perpendicular to a plane of each of the layers.

4. The method of claim 3, wherein the first periodic component comprises a grating and the second periodic component comprises periodic regions in which a portion of the grating is removed.

5. The method of claim 1, wherein the first periodic component is provided in a first layer and the second periodic component is provided in a second layer, the second layer being above or below the first layer.

6. The method of claim 1, wherein the first periodic component and the second periodic component are formed at different times, are formed using different lithographic processes, or both.

7. The method of claim 1, wherein the radiation received by the optical apparatus is used to measure a parameter representing a degree of asymmetry in the target structure, the asymmetry resulting in a difference between opposite or different diffraction orders in measurement radiation diffracted from the target structure.

8. The method of claim 1, wherein the first periodic component is formed by a process configured to form three or more features that are nominally spaced apart from each other by a common separation distance; and comprising measuring the target structure to obtain a deviation in one or more of the separation distances caused by one or more errors in the process.

9. The method of claim 8, wherein a combined pitch of the first periodic component and the second periodic component is longer when a deviation in one or more of the separation distances is present than when a deviation in one or more of the separation distances is not present.

10. The method of claim 9, wherein the measuring of the target is such that a predetermined higher order diffraction component is detected when the combined pitch is longer due to the presence of a deviation in one or more of the separation distances than when the combined pitch is not longer because a deviation in one or more of the separation distances is not present.

11. The method of claim 10, wherein the deviation in the one or more of separation distances comprises a repeating sequence of different separation distances.

12. The method of claim 11, wherein the repeating sequence of different separation distances comprises an alternating sequence of a first separation distance S1 and a second separation distance S2.

13. The method of claim 1, wherein:
    the target comprises a first target sub-structure and a second target sub-structure;
    the first target sub-structure comprises a first periodic component formed by a process configured to form three or more features that are nominally spaced apart from each other by a common separation distance, wherein the process is biased in a first sense so as nominally to form an alternating sequence of a first separation distance S1 and a second separation distance S2, wherein $S1-S2=\Delta d$; and
    the second target sub-structure comprises a first periodic component formed by the same process as the process used to form the first periodic component of the first target sub-structure, except that the process is biased in a second sense, opposite to the first sense, so as nominally to form an alternating sequence of a first separation distance S1 and a second separation distance S2, wherein $S1-S2=-\Delta d$.

14. The method of claim 1, wherein the first periodic component is formed by multiple patterning.

15. A metrology apparatus for measuring a parameter of a device manufacturing process, the metrology apparatus comprising:
 a substrate comprising a target; and
 an optical apparatus configured to measure the target by illuminating the target with measurement radiation and detecting the measurement radiation scattered by the target, wherein:
 the target comprises a target structure having a first periodic component and a second periodic component; and
 the optical apparatus is configured to receive radiation resulting from diffraction of the measurement radiation from the target structure, the received radiation comprising at least one diffraction order that would not be received from diffraction of the measurement radiation from the first periodic component alone nor from diffraction of the measurement radiation from the second periodic component alone.

16. A computer program product comprising a non-transitory computer-readable medium having instructions recorded thereon, the instructions, upon execution by a computer system, configured to cause the computer system to at least:
 obtain a measurement of a target on a substrate, the measurement resulting from illumination of the target with measurement radiation and use of an optical apparatus to detect the measurement radiation scattered by the target, wherein the target comprises a target structure having a first periodic component and a second periodic component, and the optical apparatus is configured to receive radiation resulting from diffraction of the measurement radiation from the target structure, the received radiation comprising at least one diffraction order that would not be received from diffraction of the measurement radiation from the first periodic component alone nor from diffraction of the measurement radiation from the second periodic component alone; and
 determine, based on the measurement, a parameter of a device manufacturing process used to process the substrate.

17. The computer program product of claim 16, wherein a combined pitch of the first periodic component and the second periodic component is longer than a pitch of the first periodic component alone and longer than a pitch of the second periodic component alone.

18. The computer program product of claim 16, wherein the parameter represents a degree of asymmetry in the target structure, the asymmetry resulting in a difference between opposite or different diffraction orders in measurement radiation diffracted from the target structure.

19. The computer program product of claim 16, wherein the first periodic component is formed by a process configured to form three or more features that are nominally spaced apart from each other by a common separation distance; and the determining comprises determining a deviation in one or more of the separation distances caused by one or more errors in the process.

20. The computer program product of claim 16, wherein the first periodic component and the second periodic component are provided in the same layer or are provided in layers that overlap with each other in a direction perpendicular to a plane of each of the layers.

* * * * *